(12) United States Patent
Munnelly et al.

(10) Patent No.: US 7,429,445 B1
(45) Date of Patent: *Sep. 30, 2008

(54) NEGATIVE-WORKING IMAGEABLE ELEMENTS AND METHODS OF USE

(75) Inventors: Heidi M. Munnelly, Windsor, CO (US); Kevin D. Wieland, Greeley, CO (US)

(73) Assignee: Eastman Kodak Company, Rochester, NY (US)

( * ) Notice: Subject to any disclaimer, the term of this patent is extended or adjusted under 35 U.S.C. 154(b) by 0 days.

This patent is subject to a terminal disclaimer.

(21) Appl. No.: 11/682,906

(22) Filed: Mar. 7, 2007

(51) Int. Cl.
G03F 7/028 (2006.01)
G03F 7/033 (2006.01)
G03F 7/14 (2006.01)

(52) U.S. Cl. ............ 430/278.1; 430/281.1; 430/302; 430/909; 430/964

(58) Field of Classification Search ............ 430/278.1, 430/302, 281.1, 909, 964
See application file for complete search history.

(56) References Cited

U.S. PATENT DOCUMENTS

| | | | |
|---|---|---|---|
| 6,623,908 | B2 | 9/2003 | Zheng et al. |
| 6,899,994 | B2 | 5/2005 | Huang et al. |
| 7,153,632 | B1 | 12/2006 | Saraiya et al. |
| 7,175,969 | B1 | 2/2007 | Ray et al. |
| 2003/0031951 | A1 | 2/2003 | Aburano |
| 2004/0229165 | A1 | 11/2004 | Munnelly et al. |
| 2004/0260050 | A1 | 12/2004 | Munnelly et al. |
| 2005/0003285 | A1 | 1/2005 | Hayashi et al. |
| 2005/0123853 | A1 | 6/2005 | Munnelly et al. |
| 2005/0263021 | A1 | 12/2005 | Mitsumoto et al. |
| 2006/0269873 | A1 | 11/2006 | Knight et al. |
| 2008/0008957 | A1 * | 1/2008 | Munnelly et al. ........ 430/270.1 |

FOREIGN PATENT DOCUMENTS

| | | |
|---|---|---|
| EP | 0 438123 | 7/1991 |
| EP | 1 245 383 | 10/2002 |
| JP | 1998-195119 | 7/1998 |
| JP | 2000-89455 | 3/2000 |
| JP | 2000-98602 | 4/2000 |
| JP | 2000-98603 | 4/2000 |
| JP | 2002-166669 | 6/2002 |
| JP | 2002-307854 | 10/2002 |
| JP | 2004-167904 | 6/2004 |
| WO | 98/07574 | 2/1998 |

OTHER PUBLICATIONS

U.S. Appl. No. 11/475,694, filed Jun. 27, 2006 titled *Negative-Working Radiation-Sensitive Compositions And Imageable Elements* by H.M. Munnelly et al.
U.S. Appl. No. 11/441,601, filed May 26, 2006 titled *Negative-Working Radiation-Sensitive Compositions And Imageable Materials* by T.Tao et al.

* cited by examiner

*Primary Examiner*—Richard Schilling
(74) *Attorney, Agent, or Firm*—J. Lanny Tucker

(57) ABSTRACT

A radiation-sensitive composition includes a free radically polymerizable component, an initiator composition capable of generating free radicals sufficient to initiate polymerization upon exposure to imaging radiation, an infrared radiation absorbing dye having a tetraaryl pentadiene chromophore, a polymeric binder comprising a polymer backbone to which are directly or indirectly linked poly(alkylene glycol) side chains, and a nonionic phosphate acrylate having a molecular weight of at least 250. This composition can be used to prepare a negative-working imageable element that is sensitive to suitable imaging radiation and can be imaged at relatively low energy and developed either on-press or off-press.

31 Claims, No Drawings

NEGATIVE-WORKING IMAGEABLE ELEMENTS AND METHODS OF USE

FIELD OF THE INVENTION

This invention relates to negative-working imageable elements such as negative-working lithographic printing plate precursors. These imageable elements also can be developed either on-press or off-press. The invention also relates to methods of using these imageable elements.

BACKGROUND OF THE INVENTION

Radiation-sensitive compositions are routinely used in the preparation of imageable materials including lithographic printing plate precursors. Such compositions generally include a radiation-sensitive component, an initiator system, and a binder, each of which has been the focus of research to provide various improvements in physical properties, imaging performance, and image characteristics.

Recent developments in the field of printing plate precursors concern the use of radiation-sensitive compositions that can be imaged by means of lasers or laser diodes, and more particularly, that can be imaged and/or developed on-press. Laser exposure does not require conventional silver halide graphic arts films as intermediate information carriers (or "masks") since the lasers can be controlled directly by computers. High-performance lasers or laser-diodes that are used in commercially-available image-setters generally emit radiation having a wavelength of at least 700 nm, and thus the radiation-sensitive compositions are required to be sensitive in the near-infrared or infrared region of the electromagnetic spectrum. However, other useful radiation-sensitive compositions are designed for imaging with ultraviolet or visible radiation.

There are two possible ways of using radiation-sensitive compositions for the preparation of printing plates. For negative-working printing plates, exposed regions in the radiation-sensitive compositions are hardened and unexposed regions are washed off during development. For positive-working printing plates, the exposed regions are dissolved in a developer and the unexposed regions become an image.

Various radiation compositions and imageable elements containing reactive polymer binders are described in U.S. Pat. No. 6,569,603 (Furukawa) and EP 1,182,033A1 (Fujimaki et al.). The reactive polymer binders include reactive vinyl groups that are pendant to the polymer backbone. Other IR-sensitive compositions are described in U.S. Pat. Nos. 6,309,792 (Hauck et al.), 6,893,797 (Munnelly et al.), 6,787,281 (Tao et al.), and 6,899,994 (Huang et al.), U.S. Patent Application Publication 2003/0118939 (West et al.), and EP 1,079,276A1 (Lifka et al.) and EP 1,449,650A1 (Goto).

U.S. Patent Application Publication 2005-263021 (Mitsumoto et al.) describes negative-working lithographic compositions that may contain a phosphate acrylate that are allegedly developed on-press.

Phosphate acrylates have been used in radiation-sensitive composition for various purposes including copolymerization with other polymerizable monomers. In other instances, they are included as additives in combination with organoboron initiators, especially in visible- and UV-sensitive imaging compositions.

Copending and commonly assigned U.S. Ser. No. 11/475,694 (filed Jun. 27, 2006 by Munnelly et al.) describes the use of phosphate acrylates in negative-working imageable elements to provide excellent run length without the need for a post-exposure baking step.

PROBLEM TO BE SOLVED

The various radiation sensitive compositions of the art can readily be used to prepare negative-working imageable elements but they generally require the use of a post-exposure baking step ("pre-heat" step) to enhance good adhesion and run length. Omitting the post-exposure baking step can result in complete image failure following development with alkaline developers or during on-press development.

This problem is more evident when the radiation-sensitive composition is used on a sulfuric acid anodized substrate. Imaged elements having such substrates are preferred by printers because they are less prone to scratching compared to other anodized substrates, and background sensitivity is reduced during long press runs. However, maintaining good image adhesion is a challenge for negative-working elements of this type. During long print runs, they may show a loss of highlight dots long before solid image areas show signs of wear or degradation.

It would be desirable in the industry to have highly sensitive negative-working imageable compositions and elements that provide good run length but that can also be prepared for use without a post-exposure baking step. It would also be desirable to have a radiation-sensitive composition and imageable element that can be developed either off-press or on-press.

SUMMARY OF THE INVENTION

The present invention provides a negative-working imageable element comprising a substrate having thereon an imageable layer comprising:

a free radically polymerizable component, an initiator composition capable of generating free radicals sufficient to initiate polymerization of the free radically polymerizable component upon exposure to imaging infrared radiation, an infrared radiation absorbing dye having a tetraaryl pentadiene chromophore, the dye optionally comprising a boron-containing counterion, a polymeric binder comprising a polymer backbone to which are directly or indirectly linked poly(alkylene glycol) side chains, and a nonionic phosphate acrylate having a molecular weight of at least 250.

This invention also provides a method of making a negative-working printing plate comprising:

A) imagewise exposing the negative-working imageable element of this invention using imaging infrared radiation to produce exposed and non-exposed regions in the imageable layer, and B) developing the imagewise exposed element to remove only the non-exposed regions of the imageable layer.

The negative-working infrared radiation-sensitive imageable elements of this invention provide imaged elements with excellent run length without the need for a post-exposure baking step. This advantage is achieved no matter whether the imaged elements are developed "off-press" using alkaline developers or "on-press" using fountain solutions, lithographic printing inks, or mixtures thereof. These advantages are particularly noticeable using elements that include sulfuric acid anodized substrates. Elimination of the post-exposure baking step reduces the number of pre-press variables that can affect image quality and reduces energy costs.

DETAILED DESCRIPTION OF THE INVENTION

Definitions

Unless the context indicates otherwise, when used herein, the term "imageable element", "lithographic printing plate precursor", and "printing plate precursor" are meant to be references to embodiments of the present invention.

In addition, unless the context indicates otherwise, the various components described herein such as "radically polymerizable component", "boron-containing counterion", "initiator", "co-initiator", "infrared radiation absorbing dye having a tetraaryl pentadiene chromophore", "polymeric binder", "nonionic phosphate acrylate", and similar terms also refer to mixtures of such components. Thus, the use of the articles "a", "an", and "the" is not necessarily meant to refer to only a single component.

The term "single-layer imageable element" refers to an imageable element having only one imageable layer that is essential to imaging, but as pointed out in more detail below, such elements may also include one or more layers under or over (such as a topcoat) the imageable layer to provide various properties.

Moreover, unless otherwise indicated, percentages refer to percents by dry weight.

For clarification of definitions for any terms relating to polymers, reference should be made to "Glossary of Basic Terms in Polymer Science" as published by the International Union of Pure and Applied Chemistry ("IUPAC"), *Pure Appl. Chem.* 68, 2287-2311 (1996). However, any definitions explicitly set forth herein should be regarded as controlling.

"Graft" polymer or copolymer refers to a polymer having a side chain that has a molecular weight of at least 200.

The term "polymer" refers to high and low molecular weight polymers including oligomers and includes homopolymers and copolymers.

The term "copolymer" refers to polymers that are derived from two or more different monomers.

The term "backbone" refers to the chain of atoms in a polymer to which a plurality of pendant groups are attached. An example of such a backbone is an "all carbon" backbone obtained from the polymerization of one or more ethylenically unsaturated polymerizable monomers. However, other backbones can include heteroatoms wherein the polymer is formed by a condensation reaction or some other means.

Radiation-Sensitive Compositions

The radiation-sensitive compositions described herein may have any utility wherever there is a need for a coating that is polymerizable using suitable infrared radiation, and particularly where it is desired to remove unexposed regions of the coated and imaged composition. The radiation-sensitive compositions can be used to prepare an imageable layer in imageable elements such as printed circuit boards for integrated circuits, microoptical devices, paint compositions, molding compositions, color filters, photomasks, and particularly printed forms such as lithographic printing plate precursors and imaged printing plates that are defined in more detail below.

The free radically polymerizable component present in the imageable layer contains one or more compounds having any polymerizable group that can be polymerized using free radical initiation. For example, the free radically polymerizable component can contain one or more free radical polymerizable monomers or oligomers having one or more addition polymerizable ethylenically unsaturated groups, crosslinkable ethylenically unsaturated groups, ring-opening polymerizable groups, azido groups, aryldiazonium salt groups, aryldiazosulfonate groups, or a combination thereof. Similarly, crosslinkable polymers having such free radically polymerizable groups can also be used.

Suitable ethylenically unsaturated compounds that can be polymerized or crosslinked include ethylenically unsaturated polymerizable monomers that have one or more of the polymerizable groups, including unsaturated esters of alcohols, such as acrylate and methacrylate esters of polyols. Oligomers and/or prepolymers, such as urethane acrylates and methacrylates, epoxide acrylates and methacrylates, polyester acrylates and methacrylates, polyether acrylates and methacrylates, and unsaturated polyester resins can also be used. In some embodiments, the free radically polymerizable component comprises carboxy groups.

Useful free radically polymerizable components include free-radical polymerizable monomers or oligomers that comprise addition polymerizable ethylenically unsaturated groups including multiple acrylate and methacrylate groups and combinations thereof, or free-radical crosslinkable polymers. Radically polymerizable compounds include those derived from urea urethane (meth)acrylates or urethane (meth)acrylates having multiple polymerizable groups. For example, a free radically polymerizable component can be prepared by reacting DESMODUR® N100 aliphatic polyisocyanate resin based on hexamethylene diisocyanate (Bayer Corp., Milford, Conn.) with hydroxyethyl acrylate and pentaerythritol triacrylate. Other free radically polymerizable compounds are available from Sartomer Company, Inc. such as SR399 (dipentaerythritol pentaacrylate), SR355 (di-trimethylolpropane tetraacrylate), SR295 (pentaerythritol tetraacrylate), and others that would be readily apparent to one skilled in the art.

Numerous other free radically polymerizable compounds are known to those skilled in the art and are described in considerable literature including *Photoreactive Polymers: The Science and Technology of Resists*, A Reiser, Wiley, New York, 1989, pp. 102-177, by B. M. Monroe in *Radiation Curing: Science and Technology*, S. P. Pappas, Ed., Plenum, N.Y., 1992, pp. 399-440, and in "Polymer Imaging" by A. B. Cohen and P. Walker, in *Imaging Processes and Material*, J. M. Sturge et al. (Eds.), Van Nostrand Reinhold, New York, 1989, pp. 226-262. For example, useful free radically polymerizable components are also described in EP 1,182,033A1 (noted above), beginning with paragraph [0170].

In some embodiments, the free radically polymerizable component comprises carboxy groups in an amount sufficient to provide an acid number greater than 0 mg KOH per grams of polymerizable component, and generally from 0 and up to and including 200 mg KOH per gram of the polymerizable component. For example, the acid number is from 0 and up to and including 100 mg KOH/gram of polymerizable component and more typically, it is from 0 and up to and including 60 mg KOH/gram of polymerizable component.

Free radically polymerizable compounds containing carboxy groups can be prepared in a number of ways. For example, oligomers containing carboxy groups can be prepared as described in the teaching of Col. 4 (line 42) to Col. 5 (line 19) and Col. 7 (line 14) to Col. 8 (line 45) of U.S. Pat. No. 4,228,232 (Rousseau). The carboxy groups can be added to the oligomers preferably after addition of the free radical polymerizable moieties by reaction of remaining hydroxy groups on the oligomer backbone with a compound having free carboxy groups (such as a dicarboxylic acid or anhydride). The resulting oligomers can be polymerized to provide a desired carboxy-substituted polymer.

Alternatively, a poly(urea urethane)acrylate or poly(urethane)acrylate can be prepared from the reaction of a diisocyanate with a diol having free carboxy groups similarly to the preparation of allyl functional polyurethanes described in U.S. Pat. No. 5,919,600 (Huang et al.).

The free radically polymerizable component is present in the radiation-sensitive composition in an amount sufficient to render the composition insoluble in an aqueous developer after exposure to radiation. For example, the weight ratio of free radically polymerizable component to the polymeric binder (described below) is generally from about 5:95 to about 95:5, from about 10:90 to about 90:10, or from about 30:70 to about 70:30. The free radically polymerizable component can be present in an amount of at least 10 and up to and including 70%, typically at least 20 and up to and including 50%, based on the total solids in the radiation sensitive composition, or the total dry weight of the imageable layer.

The radiation-sensitive composition also includes an initiator composition that is capable of generating free radicals sufficient to initiate polymerization of the free radically polymerizable component upon exposure of the composition to imaging infrared radiation. The initiator composition is generally responsive to electromagnetic imaging radiation in the infrared or near infrared spectral regions, corresponding to the spectral range of at least 600 nm and up to and including 1500 nm, and more typically to imaging infrared radiation of at least 700 nm and up to and including 1200 nm and initiator compositions are used that are appropriate to that imaging range.

In general, suitable initiator compositions comprise compounds that include but are not limited to, amines (such as alkanol amines), thiol compounds, anilinodiacetic acids or derivatives thereof, N-phenyl glycine and derivatives thereof, N,N-dialkylaminobenzoic acid esters, N-arylglycines and derivatives thereof (such as N-phenylglycine), aromatic sulfonylhalides, trihalogenomethylsulfones, imides (such as N-benzoyloxyphthalimide), diazosulfonates, 9,10-dihydroanthracene derivatives, N-aryl, S-aryl, or O-aryl polycarboxylic acids with at least 2 carboxy groups of which at least one is bonded to the nitrogen, oxygen, or sulfur atom of the aryl moiety (such as aniline diacetic acid and derivatives thereof and other "co-initiators" described in U.S. Pat. No. 5,629,354 of West et al.), oxime ethers and oxime esters (such as those derived from benzoin), α-hydroxy or α-amino-acetophenones, alkyltriarylborates, trihalogenomethylarylsulfones, benzoin ethers and esters, peroxides (such as benzoyl peroxide), hydroperoxides (such as cumyl hydroperoxide), azo compounds (such as azo bis-isobutyronitrile), 2,4,5-triarylimidazolyl dimers (also known as hexaarylbiimidazoles, or "HABI's") as described for example in U.S. Pat. No. 4,565,769 (Dueber et al.), boron-containing compounds (such as tetraarylborates and alkyltriarylborates) and organoborate salts such as those described in U.S. Pat. No. 6,562,543 (Ogata et al.), and onium salts (such as ammonium salts, diaryliodonium salts, triarylsulfonium salts, aryldiazonium salts, and N-alkoxypyridinium salts). Other known initiator composition components are described for example in U.S Patent Application Publication 2003/0064318 (noted above).

Co-initiators can also be used, such as metallocenes (such as titanocenes and ferrocenes), polycarboxylic acids, haloalkyl triazines, thiols, or mercaptans (such as mercaptotriazoles), borate salts, and photooxidants containing a heterocyclic nitrogen that is substituted by an alkoxy or acyloxy group, as described in U.S. Pat. No. 5,942,372 (West et al.).

Useful IR-sensitive radiation-sensitive compositions include an onium salt including but not limited to, a sulfonium, oxysulfoxonium, oxysulfonium, sulfoxonium, ammonium, selenonium, arsonium, phosphonium, diazonium, or halonium salt. Further details of useful onium salts, including representative examples, are provided in U.S. Patent Application Publication 2002/0068241 (Oohashi et al.), WO 2004/101280 (Munnelly et al.), and U.S. Pat. Nos. 5,086,086 (Brown-Wensley et al.), 5,965,319 (Kobayashi), and 6,051,366 (Baumann et al.). For example, suitable phosphonium salts include positive-charged hypervalent phosphorus atoms with four organic substituents. Suitable sulfonium salts such as triphenylsulfonium salts include a positively-charged hypervalent sulfur with three organic substituents. Suitable diazonium salts possess a positive-charged azo group (that is $-N\!\!=\!\!N^+$). Suitable ammonium salts include a positively-charged nitrogen atom such as substituted quaternary ammonium salts with four organic substituents, and quaternary nitrogen heterocyclic rings such as N-alkoxypyridinium salts. Suitable halonium salts include a positively-charged hypervalent halogen atom with two organic substituents. The onium salts generally include a suitable number of negatively-charged counterions such as halides, hexafluorophosphate, thiosulfate, hexafluoroantimonate, tetrafluoroborate, sulfonates, hydroxide, perchlorate, n-butyltriphenyl borate, tetraphenyl borate, and others readily apparent to one skilled in the art.

The halonium salts are useful such as the iodonium salts. In one embodiment, the onium salt has a positively-charged iodonium, (4-methylphenyl)[4-(2-methylpropyl)phenyl]-moiety and a suitable negatively charged counterion. A representative example of such an iodonium salt is available as Irgacure® 250 from Ciba Specialty Chemicals (Tarrytown, N.Y.) that is (4-methylphenyl)[4-(2-methylpropyl)phenyl]iodonium hexafluorophosphate and is supplied in a 75% propylene carbonate solution.

Useful boron-containing compounds include organic boron salts that include an organic boron anion such as those described in the noted U.S. Pat. No. 6,569,603 that is paired with a suitable cation such as an alkali metal ion, an onium, or a cationic sensitizing dye. Useful onium cations include but are not limited to, ammonium, sulfonium, phosphonium, iodonium, and diazonium cations. Iodonium salts such as iodonium borates are useful as initiator compounds in radiation-sensitive compounds that are designed for "on-press" development (described in more detail below). They may be used alone or in combination with various co-initiators such as heterocyclic mercapto compounds including mercaptotriazoles, mercaptobenzimidazoles, mercaptobenzoxazoles, mercaptobenzothiazoles, mercaptobenzoxadiazoles, mercaptotetrazoles, such as those described for example in U.S. Pat. No. 6,884,568 (Timpe et al.) in amounts of at least 0.5 and up to and including 10 weight % based on the total solids of the radiation-sensitive composition.

Other useful initiator compositions include one or more azine compounds as described for example in U.S. Pat. No. 6,936,384 (Munnelly et al.). These compounds are organic heterocyclic compounds containing a 6-membered ring formed from carbon and nitrogen atoms. Azine compounds include heterocyclic groups such as pyridine, diazine, and triazine groups, as well as polycyclic compounds having a pyridine, diazine, or triazine substituent fused to one or more aromatic rings such as carbocyclic aromatic rings. Thus, the azine compounds include, for example, compounds having a quinoline, isoquinoline, benzodiazine, or naphthodiazine substituent. Both monocyclic and polycyclic azine compounds are useful.

Useful azine compounds are triazine compounds that include a 6-membered ring containing 3 carbon atoms and 3 nitrogen atoms such as those described in U.S. Pat. Nos.

6,309,792 (Hauck et al.), 6.010,824 (Komano et al.), 5,885, 746 (Iwai et al), 5,496,903 (Watanabe et al.), and 5,219,709 (Nagasaka et al.).

The azinium form of azine compounds can also be used if desired. In azinium compounds, a quaternizing substituent of a nitrogen atom in the azine ring is capable of being released as a free radical. The alkoxy substituent that quaternizes a ring nitrogen atom of the azinium nucleus can be selected from among a variety of alkoxy substituents.

Halomethyl-substituted triazines, such as trihalomethyl triazines, are useful in the initiator composition. Representative compounds of this type include but are not limited to, 1,3,5-triazine derivatives such as those having 1 to 3 —$CX_3$ groups wherein X independently represent chlorine or bromine atoms, including polyhalomethyl-substituted triazines and other triazines, such as 2,4-trichloromethyl-6-methoxyphenyl triazine, 2-phenyl-4,6-bis(trichloromethyl)-s-triazine, 2,4,6-tris(trichloromethyl)-s-triazine, 2-methyl-4,6-bis (trichloromethyl)-s-triazine, 2-(styryl-4,6-bis (trichloromethyl)-s-triazine, 2-(p-methoxystyryl)-4,6-bis (trichloromethyl)-s-triazine, 2-(4-methoxy-naphtho-1-yl)-4, 6-bis(trichloromethyl)-s-triazine, 2-(4-ethoxynaphtho-1yl)- 4,6-bis(trichloromethyl)-s-triazine, and 2-(4-(2-ethoxyethyl)-naphtho-1-yl)-4,6-bis(trichloromethyl)-s-triazine], 2-(4-methylthiophenyl)-4,6-bis(trichloromethyl)- 2-triazine, 2-(4-chlorophenyl-4,6-bis(trichloromethyl)-2-triazine, 2,4,6-tri(trichloromethyl)-2-triazine, and 2,4,6-tri (tribromomethyl)-2-triazine.

The azine compounds may be used alone or in combination with one or more co-initiators such as titanocenes, mono- and polycarboxylic acids, hexaarylbisimidazoles, as described for example in U.S. Pat. No. 4,997,745 (Kawamura et al.).

In some embodiments, the radiation-sensitive composition also includes a mercaptan derivative such as a mercaptotriazole such as 3-mercapto-1,2,4-triazole, 4-methyl-3-mercapto-1,2,4-triazole, 5-mercapto-1-phenyl-1,2,4-triazole, 4-amino-3-mercapto-1,2,4,-triazole, 3-mercapto-1,5-diphenyl-1,2,4-triazole, and 5-(p-aminophenyl)-3-mercapto-1,2, 4-triazole. Various mercaptobenzimidazoles, mercaptobenzothiazoles, and mercaptobenzoxazoles may also be present.

Thus, several initiator/co-initiator combinations can be used in various embodiments of the present invention, namely:

a) a triazine as described above in combination with a co-initiator that is an N-aryl, S-aryl, or O-aryl polycarboxylic acids with at least 2 carboxy groups of which at least one is bonded to the nitrogen, oxygen, or sulfur atom of the aryl moiety (such as aniline diacetic acid and derivatives thereof) as described above, b) a triazine as described above in combination with a co-initiator that is a mercaptan derivative as described above, c) an iodonium salt (such as an iodonium borate) as described above in combination with a co-initiator that is a metallocene (for example a titanocene or ferrocene) as described for example in U.S. Pat. No. 6,936,384 (noted above), d) an iodonium salt (such as an iodonium borate) as described above in combination with a co-initiator that is a mercaptotriazole as described above, and e) a triazine as described above in combination with an alkyl triarylborate or a tetraarylborate.

The radiation-sensitive composition and the imageable element prepared therefrom include one or more boron-containing counterions that include the same or different alkyl or aryl groups, or any combination thereof (defined in more detail below). In some embodiments, a boron-containing counterion is part of the initiator composition as described for some of the initiator systems described above. In other embodiments, a boron-containing counterion is part of the infrared radiation absorbing dye (described below). In still other embodiments, the same or different boron-containing counterion is part of both the initiator composition and the infrared radiation absorbing dye.

The free radical generating compounds in the initiator composition are generally present in the radiation-sensitive composition in an amount of at least 0.5% and up to and including 30%, and typically at least 1 and up to and including about 15%, based on composition total solids or total dry weight of the imageable layer. The optimum amount of the various initiator components may differ for various compounds and the sensitivity of the radiation-sensitive composition that is desired and would be readily apparent to one skilled in the art.

Any of a variety of polymeric binders can be used in the radiation-sensitive composition, including those known in the art for use in negative-working radiation-sensitive compositions. The polymeric binders generally have a molecular weight of at least 2,000 and up to and including 1,000,000, at least 10,000 and up to and including 200,000, or at least 10,000 and up to and including 100,000. The acid value (mg KOH/g) of the polymeric binder is generally from about 0 and up to and including 400, at least 0 and up to and including 200, or at least 0 and up to and including 130, as determined using known methods.

However, the predominant polymeric binders (at least 60 weight % of total dry polymeric binders) in the radiation-sensitive composition (and imageable elements described below) are those having poly(alkylene glycol) side chains directly or indirectly linked to the polymeric backbone. Typically, at least 5 weight % and up to and including 100 weight % of the total polymeric binders are composed of one or more of such polymeric binders.

Many of such polymeric binders are dispersible, developable, or soluble in water or water/solvent mixtures such as fountain solutions or mixtures of fountain solutions and lithographic printing inks. Such polymeric binders include polymeric emulsions, dispersions, or polymers having the pendant poly(alkylene glycol) side chains that can render the imageable elements as "on-press" developable. Such polymeric binders are described for example in U.S. Pat. Nos. 6,582,882 and 6,899,994 (both noted above). In some instances, these polymeric binders are present in the imageable layer at least partially and possibly entirely, as discrete particles.

Other useful polymeric binders have hydrophobic backbones and comprise both of the following a) and b) recurring units, or the b) recurring units alone:

a) recurring units having pendant cyano groups attached directly to the hydrophobic backbone, and b) recurring units having pendant groups comprising poly (alkylene glycol) side chains.

These polymeric binders comprise poly(alkylene glycol) and cyano side chains. These polymers can be graft copolymers having a main chain polymer and poly(alkylene glycol) pendant side chains. Other polymers are block copolymers having blocks or segments of (alkylene glycol)-containing recurring units and non(alkylene glycol)-containing recurring units. Both graft and block copolymers can additionally have pendant cyano groups attached directly to the hydrophobic backbone. The alkylene glycol side chains generally comprise at least 10 constitutional alkylene glycol units and up to and including 150 of such units, at least 10 and up to and including 100 of such units, at least 10 and up to and including 50 of such alkylene glycol units, or at least 15 and up to and including 50 of such alkylene glycol units. The constitutional alkylene glycol units can be the same or different in an individual side chain and are generally $C_1$ to $C_6$ alkylene glycol groups, and more typically $C_1$ to $C_3$ alkylene glycol groups. The alkylene portions can be linear or branched or substituted versions thereof. Poly(ethylene glycol) and poly(propylene glycol) side chains are useful.

As noted above, in some embodiments, the polymeric binders comprise recurring units comprising the poly(alkylene glycol) side chains as well as recurring units having pendant cyano groups attached directly to the hydrophobic backbone. By way of example only, such recurring units can comprise pendant groups comprising —CN, cyano-substituted or cyano-terminated alkylene groups. Recurring units can also be derived from ethylenically unsaturated polymerizable monomers such as acrylonitrile, methacrylonitrile, methyl cyanoacrylate, ethyl cyanoacrylate, or a combination thereof. However, cyano groups can be introduced into the polymer by other conventional means. Examples of such cyano-containing polymeric binders are described for example in U.S. Patent Application Publication 2005/003285 (Hayashi et al.).

By way of example, polymeric binders that are useful in the IR-sensitive compositions and imageable elements can be formed by polymerization of a combination or mixture of suitable ethylenically unsaturated polymerizable monomers or macromers, such as:

A) acrylonitrile, methacrylonitrile, or a combination thereof,

B) poly(alkylene glycol) esters of acrylic acid or methacrylic acid, such as poly(ethylene glycol) methyl ether acrylate, poly(ethylene glycol) methyl ester methacrylate, or a combination thereof, and C) optionally, monomers such as acrylic acid, methacrylic acid, styrene, hydroxystyrene, acrylate esters, vinyl carbazole, methacrylate esters, acrylamide, N-phenyl maleimide, carboxyphenyl methacrylamide, allyl methacrylate, carboxyphenyl maleimide, 2-acrylamido-2-methyl-1-propane sulfonic acid, methacrylamide, or a combination of such monomers.

The amount of the poly(alkylene glycol) side chains in such polymeric binders is at least 0.5 and up to and including 60 weight %, at least 2 and up to and including 50 weight %, at least 5 and up to and including 40 weight %, or at least 5 and up to and including 20 weight %, based on the total polymeric binder weight. The amount of poly(alkylene glycol) segments in block copolymers is generally at least 5 and up to and including 60 weight %, at least 10 and up to and including 50 weight %, or at least 10 and up to and including 30 weight %.

Where the polymeric binders comprise pendant cyano groups, the amount of such cyano groups is at least 5 and up to and including 99.5 weight %, at least 10 and up to and including 80 weight %, or at least 25 and up to and including 60 weight %, based on the total polymeric binder weight.

The polymeric binders comprising (alkylene glycol) side chains are generally present in an amount of at least 10 and up to and including 90%, or at least 20 and up to and including 80%, based on the total solids content of the radiation-sensitive composition or the dry weight of the imageable layer prepared therefrom.

In some embodiments, it may be useful to include a "secondary" polymeric binder in combination with the polymeric binders described above. Such secondary polymeric binders include acrylic-urethane hybrid polymers that are commercially available in dispersions from Air Products and Chemicals, Inc. (Allentown, Pa.) under the tradename Hybridur, for example, the Hybridur 540, 560, 570, 580, 870, and 878 acrylic-urethane hybrid dispersions. Other secondary polymeric binders are water-insoluble but soluble in conventional alkaline developers. Examples of such polymeric binders include but are not limited to, (meth)acrylic acid and acid ester resins [such as (meth)acrylates], polyvinyl acetals, phenolic resin, polymers derived from styrene, N-substituted cyclic imides or maleic anhydrides, such as those described in EP 1,182,033 (noted above) and U.S. Pat. Nos. 6,309,792 (noted above), 6,352,812 (Shimazu et al.), 6,569,603 (noted above), and 6,893,797 (noted above). Also useful are the vinyl carbazole polymers described in copending and commonly assigned U.S. Ser. No. 11/356,518 (filed Feb. 17, 2006 by Tao et al.) and the polymers having pendant vinyl groups as described in copending and commonly assigned Ser. No. 11/349,376 (filed Feb. 7, 2006 by Tao et al.), both of which are incorporated herein by reference. The secondary polymeric binder may be present in the radiation-sensitive composition in an amount of from about 5 to about 40 weight % based on the total solids content of the composition, or the dry coated weight of the imageable layer.

The radiation-sensitive composition includes one or more infrared radiation absorbing dyes, or sensitizers, that absorb imaging infrared radiation, or sensitize the composition to imaging infrared radiation having a $\lambda_{max}$ of from about 600 nm and up to and including 1500 nm. Some sensitizers can be used at any wavelength, but most sensitizers are optimally useful within certain wavelength ranges.

The one or more infrared radiation absorbing dyes have a tetraaryl pentadiene chromophore. Such chromophore generally includes a pentadiene linking group having 5 carbon atoms in the chain, to which are attached two substituted or unsubstituted aryl groups at each end of the linking group. The pentadiene linking group can also be substituted with one or more substituents in place of the hydrogen atoms, or two or more hydrogen atoms can be replaced with atoms to form a ring in the linking group as long as there are alternative carbon-carbon single bonds and carbon-carbon double bonds in the chain.

For example, representative useful IR-sensitive dyes can be defined by the following Structure DYE-I:

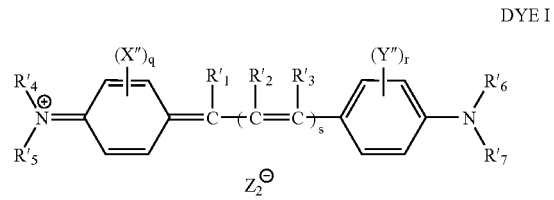

DYE I wherein $R_1'$, $R_2'$, and $R_3'$ each independently represents hydrogen, or a halo, cyano, substituted or unsubstituted alkoxy (having 1 to 8 carbon atoms, both linear and branched alkoxy groups), substituted or unsubstituted aryloxy (having 6 to 10 carbon atoms in the carbocyclic ring), substituted or unsubstituted acyloxy (having 2 to 6 carbon atoms), carbamoyl, substituted or unsubstituted acyl, substituted or unsubstituted acylamido, substituted or unsubstituted alkylamino (having at least one carbon atom), substituted or unsubstituted carbocyclic aryl groups (having 6 to 10 carbon atoms in the aromatic ring, such as phenyl and naphthyl groups), substituted or unsubstituted alkyl groups (having 1 to 8 carbon atoms, both linear and branched isomers), substituted or unsubstituted arylamino, or substituted or unsubstituted heteroaryl (having at least 5 carbon and heteroatoms in the ring)

group. Alternatively, any two of $R_1'$, $R_2'$, and $R_3'$ groups may be joined together or with an adjacent aromatic ring to complete a 5- to 7-membered substituted or unsubstituted carbocyclic or heterocyclic ring.

For example, $R_1'$, $R_2'$, and $R_3'$ are independently hydrogen, a substituted or unsubstituted carbocyclic aryl group, and a substituted or unsubstituted heteroaryl group.

$R_4'$, $R_5'$, $R_6'$, and $R_7'$ each independently represents hydrogen, a substituted or unsubstituted alkyl group (having 1 to 10 carbon atoms), a substituted or unsubstituted cycloalkyl group (having from 4 to 6 carbon atoms in the ring), a substituted or unsubstituted aryl group (having at least 6 carbon atoms in the ring), or a substituted or unsubstituted heteroaryl group (having 5 to 10 carbon and heteroatoms in the ring).

Alternatively, $R_4'$ and $R_5'$ or $R_6'$ and $R_7'$ can be joined together to form a substituted or unsubstituted 5- to 9-membered heterocyclic ring, or $R_4'$, $R_5'$, $R_6'$, or $R_7'$ can be joined to the carbon atom of the adjacent aromatic ring at a position ortho to the position of attachment of the anilino nitrogen to form, along with the nitrogen to which they are attached, a substituted or unsubstituted 5- or 6-membered heterocyclic ring.

For example, $R_4'$, $R_5'$, $R_6'$, and $R_7'$ are independently a substituted or unsubstituted alkyl group, a substituted or unsubstituted cycloalkyl group, a substituted or unsubstituted aryl group, or $R_4'$ and $R_5'$ or $R_6'$ and $R_7'$ can be joined together to form a substituted or unsubstituted 5- to 7-membered heterocyclic ring. Also, they can be independently substituted or unsubstituted alkyl groups of 1 to 8 carbon atoms, substituted or unsubstituted phenyl groups, or $R_4'$ and $R_5'$ or $R_6'$ and $R_7'$ can be joined together to form a substituted or unsubstituted 5- to 7-membered heteroaryl group.

In the DYE I structure, s is 2, $Z_2$ is a monovalent anion, X" and Y" are each independently $R_1'$ or the atoms necessary to complete a substituted or unsubstituted 5- to 7-membered fused carbocyclic or heterocyclic ring, and q and r are independently integers from 1 to 4.

For example, and X" and Y" are independently hydrogen or the carbon and heteroatoms needed to provide a fused aryl or heteroaryl ring.

Useful bis(aminoaryl)polymethine IR dyes can be synthesized using general procedures described below. The dyes may be provided for incorporation into the radiation-sensitive formulations in any suitable manner.

Further details of such bis(aminoaryl)pentadiene IR dyes are provided, including representative IR dyes identified as DYE 1 through DYE 17, DYE 19, and DYE 20, in U.S. Pat. No. 6,623,908 (Zheng et al.) that is incorporated herein by reference for this IR dye description and representative compounds.

Representative IR-sensitive dyes can also be represented by the following Structure DYE-II:

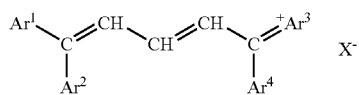

wherein $Ar^1$ through $Ar^4$ are the same or different substituted or unsubstituted aryl groups having at least carbon atoms in the aromatic ring (such as phenyl, naphthyl, and anthryl, or other aromatic fused ring systems) wherein 1 to 3 of the aryl groups are substituted with the same or different tertiary amino group (such as in the 4-position of a phenyl group). Typically two of the aryl groups are substituted with the same or different tertiary amino group, and usually at different ends of the polymethine chain (that is, molecule). For example, $Ar^1$ or $Ar^2$ and $Ar^3$ or $Ar^4$ bear the tertiary amine groups. Representative amino groups include but are not limited to those substituted with substituted or unsubstituted alkyl groups having up to 10 carbon atoms or aryl groups such as dialkylamino groups (such as dimethylamino and diethylamino), diarylamino groups (such as diphenylamino), alkylarylamino groups (such as N-methylanilino), and heterocyclic groups such as pyrrolidino, morpholino, and piperidino groups. The tertiary amino group can form part of a fused ring such that one or more of $Ar^1$ through $Ar^4$ can represent a julolidine group.

Besides the noted tertiary groups noted above, the aryl groups can be substituted with one or more substituted or unsubstituted alkyl groups having 1 to 10 carbon atoms, halo atoms (such as chloro or bromo), hydroxyl groups, thioether groups, and substituted or unsubstituted alkoxy groups having 1 to 10 carbon atoms. Substituents that contribute electron density to the conjugated system are useful. While they are not specifically shown in Structure (DYE-II), substituents or fused rings may also exist on (or as part of) the conjugated chain connecting the aryl groups.

In Structure (DYE-II), $X^-$ is a suitable counterion that may be derived from a strong acid, and include such anions as $ClO_4^-$, $BF_4^-$, $CF_3SO_3^-$, $PF_6^-$, $AsF_6^-$, $SbF_6^-$, and perfluoroethylcyclohexylsulfonate. Other cations include boron-containing counterions (borates), methylbenzenesulfonic acid, benzenesulfonic acid, methanesulfonic acid, p-hydroxybenzenesulfonic acid, p-chlorobenzenesulfonic acid, and halides.

Two representative IR dyes defined by Structure (DYE-II) are defined as D1 and D2 in WO 98/07574 (Patel et al.) that is incorporated by reference for these dyes and the synthetic method described therein.

Representative useful IR-sensitive dyes are also represented by the following Structure (DYE-III):

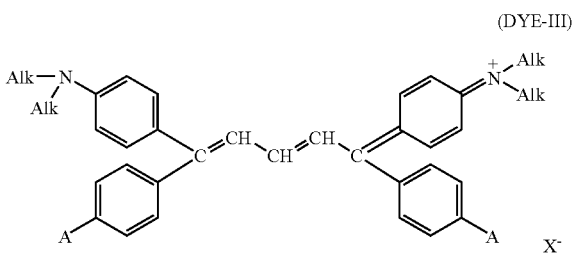

wherein "Alk" represents the same or different substituted or unsubstituted alkyl groups having 1 to 7 carbon atoms (such as substituted or unsubstituted methyl, ethyl, iso-propyl, t-butyl, n-hexyl, and benzyl), and "A" represents hydrogen or the same or different substituted or unsubstituted lower alkyl group having 1 to 3 carbon atoms (such as methyl, ethyl, n-propyl, and iso-propyl), or the same or different dialkylamino groups similar to those defined above for Structure (DYE-2), wherein such groups have the same or different alkyl groups. $X^-$ is a suitable counterion as defined above for Structure (DYE-II).

Some embodiments of this invention include a borate such as a tetra-substituted borate, which substituents can be the same or different alkyl (having 1 to 20 carbon atoms) or aryl groups (phenyl or naphthyl groups), which groups can be further substituted if desired. Particularly useful boron-containing counterions of this type include alkyltriarylborates, dialkyldiarylborates, and tetraarylborates. Examples of these boron-containing counterions are described for example, in EP 438,123A2 (Murofushi et al.).

A representative infrared radiation absorbing dye is shown in the Examples below as IR Dye 1. Other useful dyes of this type are described as Dyes 2,3-A, 3-B, 3-C, 12, and 22 described in EP 438,123A2 (noted above)

Useful infrared radiation absorbing dyes can be obtained from a number of commercial sources including Showa Denko (Japan) or they can be prepared using known starting materials and procedures. For example, IR dyes represented by Structure (DYE-I) can be prepared using the synthetic method illustrated in U.S. Pat. No. 6,623,908 (noted above) just before the examples, and IR dyes represented by Structures (DYE-II) and (DYE-III) can be prepared using the synthetic procedure described on page 10 (lines 11-14) of WO 98/07574 (noted above).

The infrared radiation absorbing compound (or sensitizer) can be present in the radiation-sensitive composition in an amount generally of at least 0.1% and up to and including 30% and preferably at least 2 and up to and including 15%, based on total solids in the composition, that also corresponds to the total dry weight of the imageable layer. Alternatively, the amount can be defined by an absorbance in the range of at least 0.05 and up to and including 3, and preferably at least 0.1 and up to and including 1.5, in the dry film as measured by reflectance UV-visible spectrophotometry. The particular amount needed for this purpose would be readily apparent to one skilled in the art, depending upon the specific compound used.

The radiation-sensitive composition further comprises one or more nonionic phosphate acrylates, each of which has a molecular weight generally greater than 250 and typically at least 300 and up to and including 1000. By "nonionic" we mean that the phosphate acrylates not only are neutral in charge but they have no internal positive or negative charges. Thus, they are not internal salts or salts formed with an external cation or anion. Moreover, by "phosphate acrylate" we also meant to include "phosphate methacrylates" and other derivatives having substituents on the vinyl group in the acrylate moiety.

Each phosphate moiety may be connected to an acrylate moiety by an alkyleneoxy chain, that is a -(alkylene-O)$_m$- chain composed of at least one alkyleneoxy unit, in which the alkylene moiety has 2 to 6 carbon atoms and can be either linear or branched and m is 1 to 10. For example, the alkyleneoxy chain can comprise ethyleneoxy units, and m is from 2 to 8 or m is from 3 to 6. The alkyleneoxy chains in a specific compound can be the same or different in length and have the same or different alkylene group.

Representative nonionic phosphate acrylates useful in this invention can be represented by the following Structure (I):

$$P(=O)(OH)_n(R)_{3-n} \quad (I)$$

wherein the R groups are independently the same or different groups represented by the following Structure (II):

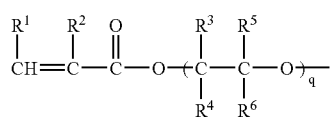

(II)

wherein $R^1$ and $R^2$ are independently hydrogen, or a halo group (such as fluoro, chloro, bromo, or iodo) or a substituted or unsubstituted alkyl group having 1 to 4 carbon atoms (such as methyl, chloromethyl, ethyl, isopropyl, n-butyl, and t-butyl). For example, $R^1$ and $R^2$ are independently hydrogen, methyl, or chloro, and typically, they are independently hydrogen or methyl.

R through $R^6$ are independently hydrogen or a substituted or unsubstituted alkyl group having 1 to 5 carbon atoms (such as methyl, chloromethyl, hydroxymethyl, ethyl, iso-propyl, n-butyl, t-butyl, and n-pentyl). For example, $R^3$ through $R^6$ are independently hydrogen or substituted or unsubstituted methyl or ethyl groups, and typically, they are independently hydrogen or unsubstituted methyl groups.

Also, in Structure I, n is 1 or 2.

In Structure II, q is 1 to 10, or from 2 to 8, for example from 3 to 6.

Representative nonionic phosphate acrylates useful in this invention include but are not limited to, ethylene glycol methacrylate phosphate (available from Aldrich Chemical Co.), a phosphate of 2-hydroxyethyl methacrylate that is available as Kayamer PM-2 from Nippon Kayaku (Japan) that is shown below, a phosphate of caprolactone modified 2-hydroxyethyl methacrylate that is available as Kayamer PM-21 (Nippon Kayaku, Japan) that is also shown below, and an ethylene glycol methacrylate phosphate with 4-5 ethoxy groups that is available as Phosmer PE from Uni-Chemical Co., Ltd. (Japan) that is also shown below. Other useful nonionic phosphate acrylates are also shown below.

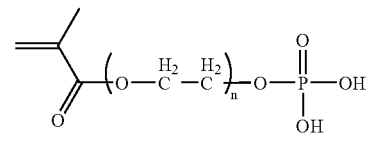

Phosmer PE (n = 4 or 5)

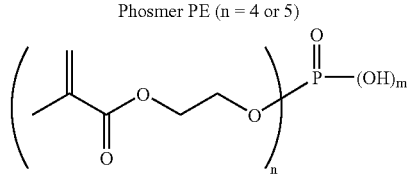

Kayamer PM-2 (m = 1 or 2, n = 3 - m)

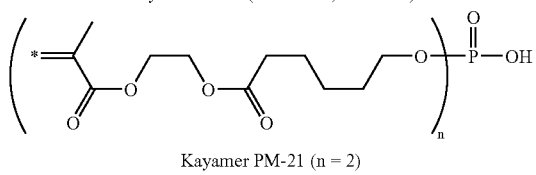

Kayamer PM-21 (n = 2)

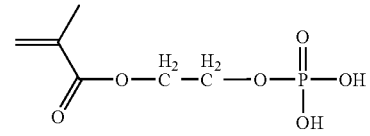

Phosmer M

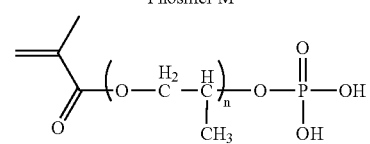

Phosmer PP (n = 5 or 6)

The nonionic phosphate acrylate is present in the radiation-sensitive composition in an amount of at least 0.6 and up to and including 20% and typically at least 0.9 and up to and including 10%, by weight of the total solids. In the dry imageable layers of the imageable elements, the amount of nonionic phosphate acrylate is present in an amount of at least 8 mg/m$^2$ and up to and including 300 mg/m$^2$ and typically at least 10 and up to and including about 150 mg/m$^2$.

The nonionic phosphate acrylates useful in this invention can be prepared using known reaction conditions and starting materials and several of them are available from commercial sources.

The radiation-sensitive composition can also include a "primary additive" that is a poly(alkylene glycol) or an ether or ester thereof that has a molecular weight of at least 200 and up to and including 4000. This primary additive is present in an amount of at least 2 and up to and including 50 weight %, based on the total solids content of the composition, or the total dry weight of the imageable layer.

Particularly useful primary additives include, but are not limited to, one or more of polyethylene glycol, polypropylene glycol, polyethylene glycol methyl ether, polyethylene glycol dimethyl ether, polyethylene glycol monoethyl ether, polyethylene glycol diacrylate, ethoxylated bisphenol A di(meth)acrylate, and polyethylene glycol mono methacrylate. Also useful are SR9036 (ethoxylated (30) bisphenol A dimethacrylate), CD9038 (ethoxylated (30) bisphenol A diacrylate), and SR494 (ethoxylated (5) pentaerythritol tetraacrylate), and similar compounds all of which that can be obtained from Sartomer Company, Inc. In some embodiments, the primary additive may be "non-reactive" meaning that it does not contain polymerizable vinyl groups.

The radiation-sensitive composition can also include a "secondary additive" that is a poly(vinyl alcohol), a poly(vinyl pyrrolidone), poly(vinyl imidazole), or polyester in an amount of up to and including 20 weight % based on the total solids content of the composition, or the total dry weight of the imageable layer.

The radiation-sensitive composition can also include a variety of optional compounds including but not limited to, dispersing agents, humectants, biocides, plasticizers, surfactants for coatability or other properties, viscosity builders, dyes or colorants to allow visualization of the written image (such as crystal violet, methyl violet, ethyl violet, Victoria blue, malachite green, and brilliant green), pH adjusters, drying agents, defoamers, preservatives, antioxidants, development aids, rheology modifiers or combinations thereof, or any other addenda commonly used in the lithographic art, in conventional amounts. Useful viscosity builders include hydroxypropyl cellulose, hydroxyethyl cellulose, carboxymethyl cellulose, and poly(vinyl pyrrolidones).

As examples of useful antioxidants, which may act to extend shelf-life of the imageable element, are compounds that prevent oxidation of the polymeric binder(s) or infrared radiation absorbing dyes including but not limited to, phosphorus-containing antioxidants, sulfur-based antioxidants, amine-containing antioxidants, and phenol-containing antioxidants. Examples of such antioxidants and useful amounts are described in [0051]-[0060] of U.S. Patent Application Publication 2003/0031951 (Aburano), which antioxidant disclosure is incorporated herein by reference.

Imageable Elements

The imageable elements are formed by suitable application of a radiation-sensitive composition as described above to a suitable substrate to form an imageable layer. This substrate can be treated or coated in various ways as described below prior to application of the radiation-sensitive composition. Typically, there is only a single imageable layer comprising the radiation-sensitive composition. If the substrate has been treated to provide an "interlayer" for improved adhesion or hydrophilicity, the applied radiation-sensitive composition is generally considered the "top" or outermost layer. These interlayers, however, are not considered "imageable layers". While there is usually no need to apply what is conventionally known as an overcoat (such as an oxygen impermeable topcoat) to the imageable layer(s) as described in WO 99/06890 (Pappas et al.), it can be disposed thereon if desired, particular for imageable elements designed for imaging exposure in the range of from about 250 to about 450 nm. Such overcoat layers can comprise one or more water-soluble polymers such as poly(vinyl alcohol), poly(vinyl pyrrolidone), poly(ethyleneimine), and poly(vinyl imidazole) and generally have a dry coating weight of at least 0.1 and up to and including 4 g/m$^2$.

The substrate generally has a hydrophilic surface, or at least a surface that is more hydrophilic than the applied radiation-sensitive composition on the imaging side. The substrate comprises a support that can be composed of any material that is conventionally used to prepare imageable elements such as lithographic printing plates. It is usually in the form of a sheet, film, or foil, and is strong, stable, and flexible and resistant to dimensional change under conditions of use so that color records will register a full-color image. Typically, the support can be any self-supporting material including polymeric films (such as polyester, polyethylene, polycarbonate, cellulose ester polymer, and polystyrene films), glass, ceramics, metal sheets or foils, or stiff papers (including resin-coated and metallized papers), or a lamination of any of these materials (such as a lamination of an aluminum foil onto a polyester film). Metal supports include sheets or foils of aluminum, copper, zinc, titanium, and alloys thereof.

Polymeric film supports may be modified on one or both flat surfaces with a "subbing" layer to enhance hydrophilicity, or paper supports may be similarly coated to enhance planarity. Examples of subbing layer materials include but are not limited to, alkoxysilanes, amino-propyltriethoxysilanes, glycidioxypropyl-triethoxysilanes, and epoxy functional polymers, as well as conventional hydrophilic subbing materials used in silver halide photographic films (such as gelatin and other naturally occurring and synthetic hydrophilic colloids and vinyl polymers including vinylidene chloride copolymers).

One useful substrate is composed of an aluminum support that may be treated using techniques known in the art, including roughening of some type by physical (mechanical) graining, electrochemical graining, or chemical graining, usually followed by acid anodizing. The aluminum support can be roughened by physical or electrochemical graining and then anodized using phosphoric or sulfuric acid and conventional procedures. A useful substrate is an electrochemically grained and sulfuric acid anodized aluminum support.

Sulfuric acid anodization of the aluminum support generally provides an oxide weight (coverage) on the surface of from about 1.5 to about 5 g/m$^2$ and more typically from about 3 to about 4.3 g/m$^2$. Phosphoric acid anodization generally provides an oxide weight on the surface of from about 1.5 to about 5 g/m$^2$ and more typically from about 1 to about 3 g/m$^2$. When sulfuric acid is used for anodization, higher oxide weight (at least 3 g/m$^2$) may provide longer press life.

An interlayer may be formed by treatment of the aluminum support with, for example, a silicate, dextrine, calcium zirconium fluoride, hexafluorosilicic acid, poly(vinyl phosphonic acid) (PVPA), vinyl phosphonic acid copolymer, poly(acrylic acid), or acrylic acid copolymer. Still further, the aluminum support may be treated with a phosphate solution that may further contain an inorganic fluoride (PF). The aluminum support can be electrochemically-grained, sulfuric acid-anodized, and treated with PVPA or PF using known procedures to improve surface hydrophilicity.

The thickness of the substrate can be varied but should be sufficient to sustain the wear from printing and thin enough to wrap around a printing form. Useful embodiments include a treated aluminum foil having a thickness of at least 100 µm and up to and including 600 µm.

The backside (non-imaging side) of the substrate may be coated with antistatic agents and/or slipping layers or a matte layer to improve handling and "feel" of the imageable element.

The substrate can also be a cylindrical surface having the radiation-sensitive composition applied thereon, and thus be an integral part of the printing press. The use of such imaging cylinders is described for example in U.S. Pat. No. 5,713,287 (Gelbart).

The radiation-sensitive composition can be applied to the substrate as a solution or dispersion in a coating liquid using any suitable equipment and procedure, such as spin coating, knife coating, gravure coating, die coating, slot coating, bar coating, wire rod coating, roller coating, or extrusion hopper coating. The composition can also be applied by spraying onto a suitable support (such as an on-press printing cylinder). Typically, the radiation-sensitive composition is applied as the outermost layer.

Illustrative of such manufacturing methods is mixing the radically polymerizable component, initiator composition, radiation absorbing compound, polymeric binder, primary additive, and any other components of the radiation-sensitive composition in a suitable organic solvent [such as methyl ethyl ketone (2-butanone), methanol, ethanol, 1-methoxy-2-propanol, iso-propyl alcohol, acetone, γ-butyrolactone, n-propanol, tetrahydrofuran, and others readily known in the art, as well as mixtures thereof], applying the resulting solution to a substrate, and removing the solvent(s) by evaporation under suitable drying conditions. Some coating solvents and representative imageable layer formulations are described in the Examples below. After proper drying, the coating weight of the imageable layer is generally at least 0.1 and up to and including 5 g/m$^2$ or at least 0.5 and up to and including 3.5 g/m$^2$.

Layers can also be present under the imageable layer to enhance developability or to act as a thermal insulating layer. The underlying layer should be soluble or at least dispersible in the developer and preferably have a relatively low thermal conductivity coefficient.

The various layers may be applied by conventional extrusion coating methods from melt mixtures of the respective layer compositions. Typically such melt mixtures contain no volatile organic solvents.

Intermediate drying steps may be used between applications of the various layer formulations to remove solvent(s) before coating other formulations. Drying steps at conventional times and temperatures may also help in preventing the mixing of the various layers.

Once the various layers have been applied and dried on the substrate, the imageable element can be enclosed in water-impermeable material that substantially inhibits the transfer of moisture to and from the imageable element.

By "enclosed", we mean that the imageable element is wrapped, encased, enveloped, or contained in a manner such that both upper and lower surfaces and all edges are within the water-impermeable sheet material. Thus, none of the imageable element is exposed to the environment once it is enclosed.

Useful water-impermeable sheet materials include but are not limited to, plastic films, metal foils, and waterproof papers that are usually in sheet-form and sufficiently flexible to conform closely to the shape of the imageable element (or stack thereof as noted below) including an irregularities in the surfaces. Typically, the water-impermeable sheet material is in close contact with the imageable element (or stack thereof). In addition, it is preferred that this material is sufficiently tight or is sealed, or both, so as to provide a sufficient barrier to the movement or transfer of moisture to or from the imageable element. Useful water-impermeable materials include plastic films such as films composed of low density polyethylene, polypropylene, and poly(ethylene terephthalate), metallic foils such as foils of aluminum, and waterproof papers such as papers coated with polymeric resins or laminated with metal foils (such as paper backed aluminum foil). The plastic films and metallic foils are most preferred. In addition, the edges of the water-impermeable sheet materials can be folded over the edges of the imageable elements and sealed with suitable sealing means such as sealing tape and adhesives.

The transfer of moisture from and to the imageable element is "substantially inhibited", meaning that over a 24-hour period, the imageable element neither loses nor gains no more than 0.01 g of water per m$^2$. The imageable element (or stack) can be enclosed or wrapped while under vacuum to remove most of the air and moisture. In addition to or instead of vacuum, the environment (for example, humidity) of the imageable element can be controlled (for example to a relative humidity of less than 20%), and a desiccant can be associated with the imageable element (or stack).

For example, the imageable element can be enclosed with the water-impermeable sheet material as part of a stack of imageable elements, which stack contains at least 5 imageable elements and more generally at least 100 or at least 500 imageable elements that are enclosed together. It may be desirable to use "dummy", "reject", or non-photosensitive elements at the top and bottom of the stack improve the wrapping. Alternatively, the imageable element can be enclosed in the form of a coil that can be cut into individual elements at a later time. Generally, such a coil has at least 1000 m$^2$ of imageable surface, and commonly at least 3000 m$^2$ of imageable surface.

Adjacent imageable elements in the stacks or adjacent spirals of the coil may be separated by interleaving material, for example interleaving paper or tissue ("interleaf paper") that may be sized or coated with waxes or resin (such as polyethylene) or inorganic particles. Many useful interleaving materials are commercially available. They generally have a moisture content of less than 8% or typically less than 6%.

Imaging Conditions

During use, the imageable element is exposed to a suitable source of imaging infrared radiation at a wavelength of from about 600 to about 1500 nm. In some embodiments, imaging is carried out using imaging or exposing radiation, such as from an infrared laser at a wavelength of at least 700 nm and up to and including about 1400 nm and typically at least 700 nm and up to and including 1200 nm. Imaging can be carried out using imaging infrared radiation at multiple wavelengths at the same time if desired.

The laser used to expose the imageable element is generally a diode laser, because of the reliability and low maintenance of diode laser systems, but other lasers such as gas or solid-state lasers may also be used. The combination of power, intensity and exposure time for laser imaging would be readily apparent to one skilled in the art. Presently, high performance lasers or laser diodes used in commercially available imagesetters emit infrared radiation at a wavelength of at least 800 nm and up to and including 850 nm or at least 1060 and up to and including 1120 nm.

The imaging apparatus can function solely as a platesetter or it can be incorporated directly into a lithographic printing press. In the latter case, printing may commence immediately after imaging and development, thereby reducing press set-up time considerably. The imaging apparatus can be configured as a flatbed recorder or as a drum recorder, with the imageable member mounted to the interior or exterior cylindrical surface of the drum. An example of an useful imaging apparatus is available as models of Creo Trendsetter® platesetters available from Eastman Kodak Company (Burnaby, British Columbia, Canada) that contain laser diodes that emit near infrared radiation at a wavelength of about 830 nm. Other suitable imaging sources include the Crescent 42T Platesetter that operates at a wavelength of 1064 nm (available from Gerber Scientific, Chicago, Ill.) and the Screen PlateRite 4300 series or 8600 series platesetter (available from Screen, Chicago, Ill.). Additional useful sources of radiation include direct imaging presses that can be used to image an element while it is attached to the printing plate cylinder. An example of a suitable direct imaging printing press includes the Heidelberg SM74-DI press (available from Heidelberg, Dayton, Ohio).

Imaging with infrared radiation can be carried out generally at imaging energies of at least 30 $mJ/cm^2$ and up to and including 500 $mJ/cm^2$, or at least 50 $mJ/cm^2$ and up to and including 300 $mJ/cm^2$ depending upon the sensitivity of the imageable layer.

While laser imaging is preferred in the practice of this invention, imaging can be provided by any other means that provides thermal energy in an imagewise fashion. For example, imaging can be accomplished using a thermoresistive head (thermal printing head) in what is known as "thermal printing", described for example in U.S. Pat. No. 5,488,025 (Martin et al.). Thermal print heads are commercially available (for example, a Fujitsu Thermal Head FTP-040 MCS001 and TDK Thermal Head F415 HH7-1089).

Development and Printing

Without the need for a pre-heat step after imaging and before development, the imaged elements can be developed "off-press" using conventional processing and a conventional aqueous alkaline or organic solvent-based developer. Alternatively, the imaged elements can be developed, or imaged and developed, "on-press" as described in more detail below.

For off-press development, the developer composition commonly includes surfactants, chelating agents (such as salts of ethylenediaminetetraacetic acid), organic solvents (such as benzyl alcohol), and alkaline components (such as inorganic metasilicates, organic metasilicates, hydroxides, and bicarbonates). The pH of the alkaline developer is typically at least 8 and up to and including 14. The imaged elements are generally developed using conventional processing conditions. Both aqueous alkaline developers and solvent-based developers can be used.

Organic solvent-containing developers are generally single-phase solutions of one or more organic solvents that are miscible with or dispersible in water. Such developers may have neutral, alkaline, or slightly acidic pH. Useful organic solvents include the reaction products of phenol with ethylene oxide and propylene oxide [such as ethylene glycol phenyl ether (phenoxyethanol)], benzyl alcohol, esters of ethylene glycol and of propylene glycol with acids having 6 or less carbon atoms, and ethers of ethylene glycol, diethylene glycol, and of propylene glycol with alkyl groups having 6 or less carbon atoms, such as 2-ethylethanol and 2-butoxyethanol. The organic solvent(s) is generally present in an amount of from about 0.5 to about 15% based on total developer weight.

Representative solvent-based developers include ND-1 Developer, Developer 980, SP 200 Developer, "2-in-1" Developer, ProNeg D-501 Developer, 955 Developer, and 956 Developer (available from Kodak Polychrome Graphics a subsidiary of Eastman Kodak Company).

Aqueous alkaline developers generally have a pH of at least 7 and typically of at least 11. Useful alkaline aqueous developers include 3000 Developer, 9000 Developer, GOLDSTAR Developer, GREENSTAR Developer, ThermalPro Developer, PROTHERM Developer, MX1813 Developer, Violet 500 Developer, and MX1710 Developer (all available from Kodak Polychrome Graphics, a subsidiary of Eastman Kodak Company). These compositions also generally include surfactants, chelating agents (such as salts of ethylenediaminetetraacetic acid), and alkaline components (such as inorganic metasilicates, organic metasilicates, hydroxides, and bicarbonates).

Generally, the alkaline developer is applied to the imaged element by rubbing or wiping the outer layer with an applicator containing the developer. Alternatively, the imaged element can be brushed with the developer or the developer may be applied by spraying the outer layer with sufficient force to remove the exposed regions. Still again, the imaged element can be immersed in the developer. In all instances, a developed image is produced in a lithographic printing plate having excellent resistance to press room chemicals.

Following off-press development, the imaged element can be rinsed with water and dried in a suitable fashion. The dried element can also be treated with a conventional gumming solution (preferably gum arabic). In addition, a postbake operation can be carried out, with or without a blanket exposure to UV or visible radiation.

Printing can be carried out by applying a lithographic printing ink and fountain solution to the printing surface of the imaged and developed element. The fountain solution is taken up by the non-imaged regions, that is, the surface of the hydrophilic substrate revealed by the imaging and development steps, and the ink is taken up by the imaged (non-removed) regions of the imaged layer. The ink is then transferred to a suitable receiving material (such as cloth, paper, metal, glass, or plastic) to provide a desired impression of the image thereon. If desired, an intermediate "blanket" roller can be used to transfer the ink from the imaged member to the receiving material. The imaged members can be cleaned between impressions, if desired, using conventional cleaning means.

Some imageable elements of this invention are designed for development "on-press". This type of development avoids the use of the developing solutions described above. The imaged element is directed mounted on press wherein the unexposed regions in the imageable layer are removed by a suitable fountain solution, lithographic printing ink, or a combination of both, when the initial printed impressions are made. Typical ingredients of aqueous fountain solutions include pH buffers, desensitizing agents, surfactants and wetting agents, humectants, low boiling solvents, biocides, antifoaming agents, and sequestering agents. A representative example of a fountain solution is Varn Litho Etch 142W+Varn PAR (alcohol sub) (available from Varn International, Addison, Ill.).

The following examples are provided to illustrate the practice of the invention but are by no means intended to limit the invention in any manner.

EXAMPLES

The components and materials used in the examples and analytical methods used in evaluation were as follows:

Byk® 336 surfactant was obtained from Byk Chemie (Wallingford, Conn.).

Contrast Dye D11 is ethanaminium, N-[4-[[4-(diethylamino)phenyl][4-(ethylamino)-1-naphthalenyl]methylene]-2,5-cyclohexadien-1-ylidene]-N-ethyl-, salt with 5-benzoyl- 4-hydroxy-2-methoxybenzenesulfonic acid (1:1) as supplied by PCAS (Longjumeau, France), having the following structure:

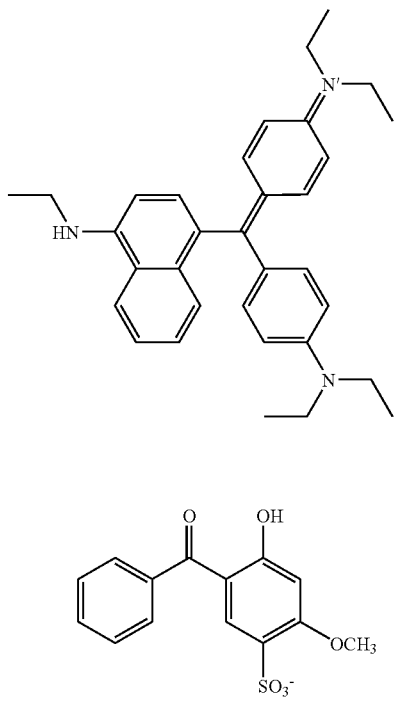

Graft Copolymer is a 24 weight % dispersion in a 76:24 mixture of n-propanol and water and is a copolymer with the composition of PEGMA/acrylonitrile/styrene with a weight ratio of 10/70/20 and was prepared as described in U.S. Patent Application Publication 2005/0003285 (noted above) as Copolymer 7. PEGMA represents poly(ethylene glycol methacrylate) (Mw 2080, Aldrich Chemical Co.).

Irgacure® 250 contains iodonium, (4, -methylphenyl)[4-(2-methylpropyl)phenyl]-,hexafluorophosphate that was obtained from Ciba Specialty Chemicals (Tarrytown, N.Y.) as a 75% (weight) solution in propylene carbonate.

IR Dye 1 is a cyanine dye within the scope of the present invention and is available from Showa Denko (Tokyo, Japan) and has the following structure:

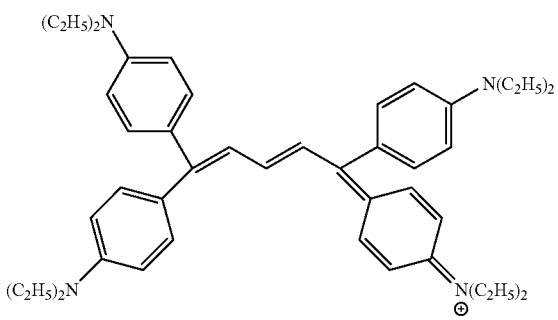

-continued

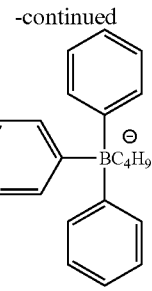

IR Dye 2 represents a cyanine dye that has the following structure:

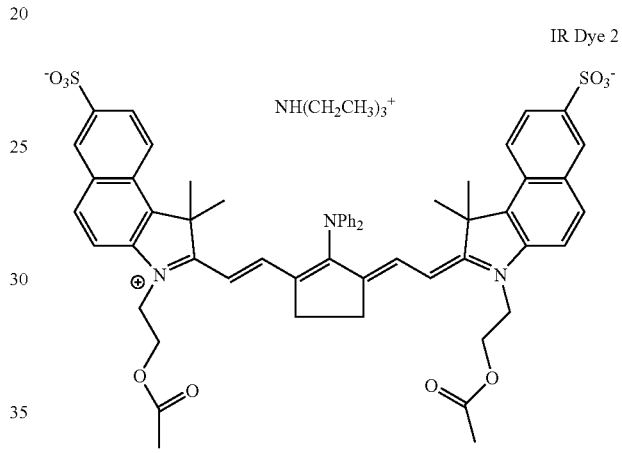

Klucel® E is a hydroxypropyl cellulose that was obtained from Hercules Inc. (Wilmington, Del.).

Mercapto-3-triazole represents mercapto-3-triazole-1H, 2,4 that was obtained from PCAS (Paris, France).

Oligomer was a urethane acrylate prepared by reacting Desmodur® N100 (an aliphatic polyisocyanate resin based on hexamethylene diisocyanate from Bayer Corp., Milford, Conn.) with hydroxyethyl acrylate and pentaerythritol triacrylate (80 wt. % in 2-butanone).

PF represents a post-treatment with an inorganic monosodium phosphate solution activated by sodium fluoride.

Phosmer PE is an ethylene glycol methacrylate phosphate with 4-5 ethoxy groups that was obtained from Uni-Chemical Co. Ltd. (Japan).

Sartomer 355 is ditrimethylolpropane tetaacrylate that was obtained from Sartomer Company (Exton, Pa.).

955 Developer is a negative developer (Eastman Kodak Company, Norwalk, Conn.).

Examples 1-2

Imageable elements were prepared by coating each of the imageable layer formulations shown in the following TABLE I (by parts) onto an electrochemically-grained and sulfuric acid-anodized aluminum support, with an oxide weight of 3.8 g/m², that had been post-treated with PF, to provide a dry coating weight of 1.0 g/m². Each imageable layer formulation was applied using a slotted hopper and dried for 60 seconds for about 82° C.

Imageable elements for Example 1 were exposed at 50 to 300 mJ/cm² on a Creo Trendsetter® 3244x imagesetter at 7.2 W. The imaged elements were then directly mounted on an ABDick duplicator press charged with Van Son rubber-based black ink. The fountain solution was Varn 142W etch at 3 oz per gallon (22.5 ml/liter) and PAR alcohol replacement at 3 oz per gallon (22.5 ml/liter). The printing press was run for approximately 200 impressions. The background printed clean from sheet 1 and all images derived by imaging at 50 to 300 mJ/cm² printed with good quality. After at least 185 days stored under ambient conditions, the background printed clean by sheet 5 and good quality images printed from elements imaged at 100 to 300 mJ/cm². The optical density of the solid exposed (imaged) regions was measured with an X-Rite 418 densitometer with the cyan filter in place. The optical densities recorded before development on-press were 0.58 for the exposed regions and 0.66 for the non-exposed regions. The exposed regions were bleached from their original color compared to the non-exposed regions.

One imageable element for Example 1 was exposed at 100 mJ/cm² on a Creo Trendsetter® 3244x imagesetter at 5 W and mounted directly on a Komori sheet-fed printing press. The press was charged with black ink containing 1.5% calcium carbonate and fitted with a compressible blanket. The fountain solution used was Varn 142W etch at 3 ounces per gallon (22.5 g/liter) and PAR alcohol replacement at 3 ounces per gallon (22.5 g/liter). The printing plate was used to produce 25,000 copies before solid wear was observed. The 2% dots printed well during the entire press run.

Imageable elements for Example 2 were exposed at 3.2 W from 25 to 250 mJ/cm² on a Creo Trendsetter® 3244x imagesetter. Non-exposed regions were removed with a 20% dilution of 955 Developer in 3 seconds. Images of good quality were produced from imaging at 25 mJ/cm² through 250 mJ/cm² exposures. After 182 days storage under ambient conditions, non-exposed regions were removed with a 20% dilution of 955 Developer in 8 seconds and good quality images were produced for exposures at from 55 to 250 mJ/cm². The optical density of the solid exposed regions was measured with an X-Rite 418 densitometer with the cyan filter in place. The optical density recorded after development was 0.83 for the exposed regions and 0.36 for the non-exposed regions. The exposed regions were highly visible.

An imageable element from Example 2 was exposed at 100 mJ/cm² on a Creo Trendsetter® 3244x imagesetter at 5 W. Non-exposed regions were removed with a 20% dilution of 955 Developer and the resulting printing plate was treated with 850 s finisher solution (Eastman Kodak Company). The imaged element was mounted on a Miehle sheet-fed printing press charged with black ink containing 1.5% calcium carbonate and fitted with a compressible blanket. The fountain solution was Varn 142W etch at 3 ounces per gallon (22.5 g/liter) and PAR alcohol replacement at 3 ounces per gallon (22.5 g/liter). The printing plate produced 31,000 copies of excellent quality. The 2% dots printed well during the entire press run.

Thus, the imageable element of Example 1 was developed on-press and the imageable element of Example 2 was developed off-press.

TABLE I

| Component | Example 1 | Example 2 |
| --- | --- | --- |
| Oligomer | 1.80 | 1.92 |
| Sartomer 355 | 0.23 | 0.25 |
| Graft Copolymer | 1.47 | 1.62 |
| Klucel ® E | 0.23 | 0.25 |
| Irganox ® 1035 | 0.02 | 0.03 |
| Irgacure ® 250 | 0.22 | 0.24 |
| Mercapto-3-triazole | 0.13 | 0.14 |
| IR Dye 1 | 0.09 | 0.10 |
| Byk ® 307 | 0.10 | 0.11 |
| Phosmer PE | 0.23 | 0.25 |
| Contrast dye D11 | 0 | 0.06 |
| 1-Propanol | 66.83 | 66.52 |
| 2-Butanone | 19.10 | 19.01 |
| Water | 9.55 | 9.50 |

Example 3

The imageable layer formulation prepared in Example 1 was applied to a brush-grained and phosphoric acid anodized substrate with an oxide weight of 1.5 g/m², which had been sub-coated with poly(acrylic acid) as described in Example 1. The resulting imageable element was imaged at 250 mJ/cm² on a Creo Trendsetter® 3244x imagesetter at 15 W and was directly mounted on Miehle sheet-fed printing press set-up. The printing press conditions were the same as those described in Example 2. The background printed clean from sheet 1 and about 16,000 impressions were printed before solid wear was observed.

Comparative Example 1

An imageable layer formulation was prepared as described in Example 1 except that IR Dye 1 was replaced with IR Dye 2 and Phosmer PE was omitted. An imageable element was prepared as described in Example 1, was exposed at 300 mJ/cm² on a Creo Trendsetter® 3244x imagesetter at 19 W, and was directly mounted on a Miehle sheet-fed printing press. The press conditions were the same as those described in Example 2. The background printed clean from sheet one. However, after 1,000 impressions, complete image failure was evident.

Comparative Example 2

A solution was prepared as described in Example 1 except that IR Dye 1 was replaced with IR Dye 2. An imageable element was prepared as described in Example 1, was exposed at 300 mJ/cm² on a Creo Trendsetter 3244x imagesetter at 19 W, and was directly mounted on a Miehle sheet-fed printing press. The press conditions were the same as those described in Example 2. The background printed clean from sheet 1 and approximately 12,000 impressions were printed when solid wear was observed.

A second Comparative Example imageable element was similarly prepared except that the oxide weight on the substrate was 2.5 g/m². After imaging in the same manner and mounting on the sheet-fed printing press, about 5,000 impressions were printed when solid wear was observed.

Comparative Example 3

An imageable formulation was prepared as described in Example 1 with the exception that the Phosmer PE was omitted. An imageable element was prepared as described in Example 1, was exposed at 100 mJ/cm² on a Creo Trendsetter 3244x imagesetter at 5 W, and was directly mounted on a Komori sheet-fed printing press. The press conditions were the same as those described in Example 1. The background printed clean from sheet 1 but by 500 copies, the highlights were failing and, after 5,000 impressions, complete image failure was observed.

The invention has been described in detail with particular reference to certain preferred embodiments thereof, but it will be understood that variations and modifications can be effected within the spirit and scope of the invention.

The invention claimed is:

1. A negative-working imageable element comprising a substrate having thereon an imageable layer comprising:
    a free radically polymerizable component,
    an initiator composition capable of generating free radicals sufficient to initiate polymerization of said free radically polymerizable component upon exposure to imaging radiation,
    an infrared radiation absorbing dye having a tetraaryl pentadiene chromophore, said dye optionally comprising a boron-containing counterion,
    a polymeric binder comprising a polymer backbone to which are directly or indirectly linked poly(alkylene glycol) side chains, and
    a nonionic phosphate acrylate having a molecular weight of at least 250.

2. The imageable element of claim 1 wherein said nonionic phosphate acrylate has at least one alkyleneoxy unit between the phosphate moiety and each acrylate moiety.

3. The imageable element of claim 1 wherein said nonionic phosphate acrylate is represented by the following Structure (I):

$$P(=O)(OH)_n(R)_{3-n} \quad (I)$$

wherein the R groups are independently the same or different groups represented by the following Structure (II):

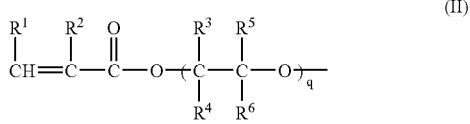

(II)

wherein $R^1$ and $R^2$ are independently hydrogen or a halo or alkyl group having 1 to 4 carbon atoms, $R^3$ through $R^6$ are independently hydrogen or alkyl groups, n is 1 or 2, and q is 1 to 10.

4. The imageable element of claim 3 wherein n is 2, $R^1$ and $R^2$ are independently hydrogen, methyl, or chloro, $R^3$ through $R^6$ are independently hydrogen or methyl or ethyl groups, and q is 2 to 8.

5. The imageable element of claim 1 wherein said initiator composition comprises a triazine and optionally a mono- or polycarboxylic acid or mercaptan as a co-initiator.

6. The imageable element of claim 1 wherein said imageable layer further comprises a boron-containing counterion that comprises four of the same or different alkyl or aryl groups, or any combination thereof.

7. The imageable element of claim 6 wherein said boron-containing counterion is a counterion for said tetraaryl pentadiene chromophore.

8. The imageable element of claim 6 wherein said initiator composition comprises said boron-containing counterion.

9. The imageable element of claim 1 wherein neither of said initiator composition nor said infrared radiation absorbing dye has a boron-containing counterion.

10. The imageable element of claim 1 wherein said initiator composition does not have a boron-containing counterion but said infrared radiation absorbing dye does have a boron-containing counterion.

11. The imageable element of claim 1 wherein said initiator composition has a boron-containing counterion but said infrared radiation absorbing dye does not have a boron-containing counterion.

12. The imageable element of claim 1 wherein both of said initiator composition and said infrared radiation absorbing dye have the same or different boron-containing counterions.

13. The imageable element of claim 1 wherein said initiator composition comprises an iodonium salt, or an iodonium salt in combination with either a mercaptotriazole or a metallocene, wherein said iodonium salt optionally comprises a boron-containing counterion.

14. The imageable element of claim 1 wherein said polymeric binder comprises poly(ethylene glycol) side chains and is present at least partially as discrete particles.

15. The imageable element of claim 1 wherein said polymeric binder also comprises pendant cyano groups.

16. The imageable element of claim 1 wherein said infrared radiation absorbing dye is represented by the following Structure (DYE-I):

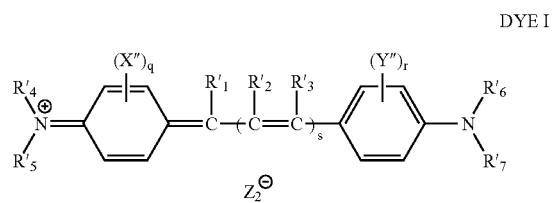

DYE I wherein $R_1'$, $R_2'$, and $R_3'$ each independently represents hydrogen, or a halo, cyano, alkoxy, aryloxy, acyloxy, carbamoyl, acyl, acylamido, alkylamino, arylamino, alkyl, aryl, or heteroaryl group, or any two of $R_1'$, $R_2'$, and $R_3'$ groups may be joined together or with an adjacent aromatic ring to complete a 5- to 7-membered carbocyclic or heterocyclic ring, $R_4'$, $R_5'$, $R_6'$, and $R_7'$ each independently represents hydrogen, an alkyl group having 1 to 8 carbon atoms, a cycloalkyl group having 4 to 6 carbon atoms in the ring, an aryl group having 6 to 10 carbon atoms in the ring, or a heteroaryl group having 5 to 10 carbon and heteroatoms in the ring, or $R_4'$ and $R_5'$ or $R_6'$ and $R_7'$ can be joined together to form a 5- to 9-membered heterocyclic ring, or $R_4'$, $R_5'$, $R_6'$, or $R_7'$ can be joined to a carbon atom of an adjacent aromatic ring at a position ortho to the position of attachment of the anilino nitrogen to form, along with the nitrogen to which they are attached, a 5- or 6-membered heterocyclic ring, s is 2, $Z_2$ is a monovalent anion, X" and Y" are independently $R_1'$ or the atoms necessary to complete a 5- to 7-membered fused carbocyclic or heterocyclic ring, and q and r are independently integers of from 1 to 4.

17. The imageable element of claim 1 wherein said infrared radiation absorbing dye is represented by the following Structure (DYE-II):

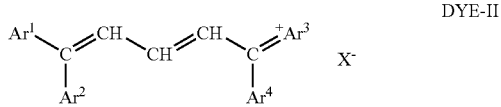

DYE-II wherein Ar¹ through Ar⁴ are the same or different aryl groups wherein at least one and up to three of the aryl groups is substituted with a tertiary amino group, and X⁻ is a counterion.

18. The imageable element of claim 17 wherein at least two of said aryl groups at different ends of the molecule are substituted with the same or different tertiary amino groups, and X⁻ is a boron-containing counterion.

19. The imageable element of claim 1 wherein said infrared radiation absorbing dye is represented by the following Structure (DYE-III):

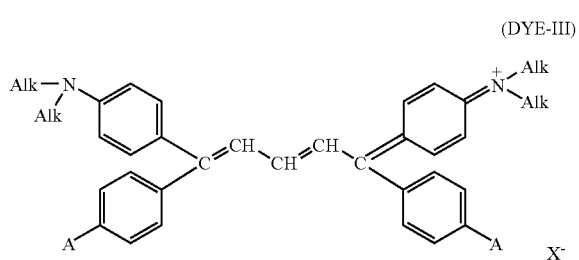

(DYE-III)

wherein Alk represents the same or different alkyl groups having 1 to 7 carbon atoms, A represents hydrogen or the same or different substituted or unsubstituted lower alkyl group having 1 to 3 carbon atoms or the same or different dialkylamino groups, and X⁻ is a counterion.

20. The imageable element of claim 19 wherein X⁻ is a boron-containing counterion.

21. The imageable element of claim 20 wherein said boron-containing counterion is an alkyltriphenyl borate.

22. The imageable element of claim 18 wherein said infrared radiation absorbing dye is represented by the following structure:

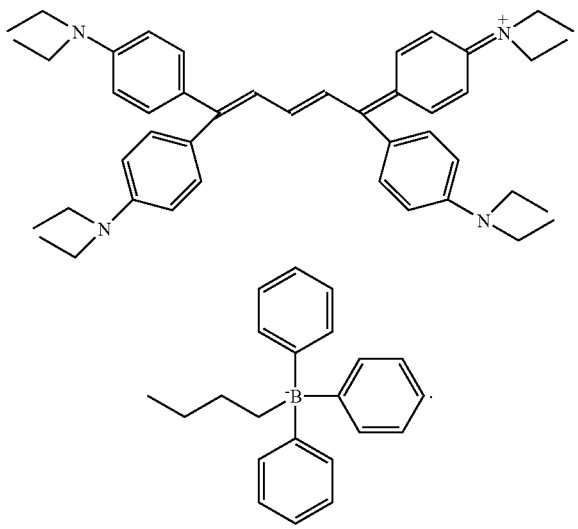

23. The imageable element of claim 1 wherein said polymeric binder comprises poly(alkylene glycol) side chains that include at least 10 alkylene glycol units, and said nonionic phosphate acrylate is a nonionic phosphate di- or triacrylate that is present in said imageable layer in an amount of at least 8 and up to and including 300 mg/m².

24. The imageable element of claim 1 wherein said infrared radiation absorbing dye is present in an amount of at least 5 and up to and including 150 mg/m².

25. The imageable element of claim 1 wherein said imageable layer further comprises a colorant.

26. The imageable element of claim 1 wherein said substrate is a sulfuric acid-anodized aluminum substrate having an oxide weight of from about 1.5 to about 5 g/m².

27. A method of making a negative-working printing plate comprising:
A) imagewise exposing the negative-working imageable element of claim 1 using imaging infrared radiation to produce exposed and non-exposed regions in each imageable layer, and
B) developing said imagewise exposed element to remove only said non-exposed regions of said imageable layer.

28. The method of claim 27 wherein step B is carried out on-press in the presence of a fountain solution, lithographic printing ink, or a combination thereof.

29. The method of claim 28 wherein both steps A and B are carried out on-press.

30. The method of claim 27 wherein step B is carried out off-press using an aqueous alkaline developer.

31. The method of claim 27 wherein said imageable element has a substrate that is a sulfuric acid-anodized aluminum substrate,
said imageable element also comprises a nonionic phosphate acrylate that is represented by the following Structure (I):

$P(=O)(OH)_n(R)_{3-n}$ (I)

wherein the R groups are independently the same or different groups represented by the following Structure (II):

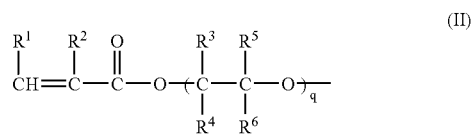

(II)

wherein R¹ and R² are independently hydrogen or a halo or alkyl group having 1 to 4 carbon atoms, R³ through R⁶ are independently hydrogen or alkyl groups, n is 1 or 2, and q is 1 to 10, a polymeric binder that comprises poly(ethylene glycol) side chains and is present at least partially as discrete particles, and optionally pendant cyano groups, and either said initiator composition, said infrared radiation absorbing dye, or both, comprise the same or different borate counterion that comprises four of the same or different alkyl or aryl groups, or any combination thereof, provided that at least one boron-containing counterion comprises at least two of the same or different aryl groups.

* * * * *